(12) United States Patent
Bai et al.

(10) Patent No.: US 8,063,413 B2
(45) Date of Patent: Nov. 22, 2011

(54) TENSILE STRAINED GE FOR ELECTRONIC AND OPTOELECTRONIC APPLICATIONS

(75) Inventors: Yu Bai, Cambridge, MA (US); Minjoo L. Lee, Hamden, CT (US); Eugene A. Fitzgerald, Windham, NH (US)

(73) Assignee: Massachusetts Institute of Technology, Cambridge, MA (US)

( * ) Notice: Subject to any disclaimer, the term of this patent is extended or adjusted under 35 U.S.C. 154(b) by 303 days.

(21) Appl. No.: 12/265,976

(22) Filed: Nov. 6, 2008

(65) Prior Publication Data

US 2009/0114902 A1 May 7, 2009

Related U.S. Application Data

(60) Provisional application No. 60/985,728, filed on Nov. 6, 2007.

(51) Int. Cl.
*H01L 29/15* (2006.01)

(52) U.S. Cl. ........ 257/200; 257/615; 257/E21.086; 257/E21.123; 257/E21.127; 257/192; 438/933; 438/938; 438/172

(58) Field of Classification Search .......... 257/18, 257/190, 192, 200, 615, E21.085, E21.123, 257/E21.127; 438/478, 172, 933, 938
See application file for complete search history.

(56) References Cited

U.S. PATENT DOCUMENTS

| | | | |
|---|---|---|---|
| 6,222,200 B1 | 4/2001 | Svilans | |
| 6,897,471 B1 | 5/2005 | Soref et al. | |
| 2004/0053477 A1 | 3/2004 | Ghyselen et al. | |
| 2005/0164473 A1* | 7/2005 | Liu et al. | 438/478 |
| 2005/0212061 A1* | 9/2005 | Langdo et al. | 257/397 |

OTHER PUBLICATIONS

Jiang et al, "Strains in Si Substrate Induced by Formation of Ge Islands", 2000, Proceedings of SPIE, vol. 4086, pp. 108-111.*
Rioux et al., "Structural and electronic properties of strained Ge/InP(100) heterostructures" Physical Review B. Mar. 15, 1992, vol. 45, No. 11, pp. 6060-6068.
Jain et al., "Diffusion length variation and proton damage coefficients for InP/InxGa1-xAs/GaAs solar cells" J. Appl. Phys. 74 (4), Aug. 15, 1993, pp. 2948-2950.
Fang et al., Perfectly tetragonal, tensile-strained Ge on Ge1-ySny buffered Si(100), Applied Physics Letters, 90, 2007, pp. 061915-1-061915-3.
Demirel et al., "Reduction in the outdiffusion into epitaxial Ge grown on GaAs using a thin AlAs interlayer" 1992 IOP Publishing Ltd, pp. 49-53.
Soref et al., "Advances in SiGeSn technology" 2007 Materials Research Society, vol. 22, No. 12, pp. 3281-3291.
Liu et al., "Silicidation-induced band gap shrinkage in Ge epitaxial films on Si" Applied Physics Letters, vol. 84, No. 5, Feb. 2004, pp. 660-662.
Fang et al., "Perfectly tetragonal, tensil-strained Ge on Ge1-ySny Buffered Si (100)" Applied Physics Letters 90, 061915 (2007) pp. 061915-1-061915-3.
Liu et al., "High-performance, tensile strained Ge p-i-n photodetectors on a Si platform" Applied Physics Letters, 87, (2005) pp. 103501-1-103501-3.

* cited by examiner

*Primary Examiner* — Ha Tran T Nguyen
*Assistant Examiner* — Suberr Chi
(74) *Attorney, Agent, or Firm* — Gesmer Updegrove LLP

(57) ABSTRACT

A semiconductor structure is provided. The semiconductor structure includes one or more III-IV material-based semiconductor layers. A tensile-strained Ge layer is formed on the one or more a III-IV material-based semiconductor layers. The tensile-strained Ge layer is produced through lattice-mismatched heteroepitaxy on the one or more a III-IV material-based semiconductor layers.

6 Claims, 15 Drawing Sheets

|  | Carrier mobility (cm$^2$/V·s) | |
| --- | --- | --- |
|  | Electron | Hole |
| 1.5% tensile-strained Ge | ~12000 | ~20000 |
| Ge | 4000 | 2000 |
| Si | 1400 | 450 |
| GaAs | 8500 | 400 |

FIG. 3

| Growth Steps | Sample *a* | Sample *b* | Sample *c* | Sample *d* | Sample *e* |
|---|---|---|---|---|---|
| 1 | GaAs homoepitaxy at 650 °C ||||||
| 2 | Cooling to 475 °C under 100 sccm AsH$_3$ flow | Cooling to 475 °C under 100 sccm AsH$_3$ flow | Anneal at 650 °C under N$_2$ ambient for 10 minutes | Cooling to 350 °C under 100 sccm AsH$_3$ flow | Cooling to 475 °C under 100 sccm AsH$_3$ flow |
| 3 | Shut off AsH$_3$, pause for 10 seconds | Shut off AsH$_3$, pause for 10 seconds | Cooling to 350 °C under N$_2$ ambient | Shut off AsH$_3$, pause for 10 seconds | Shut off AsH$_3$, pause for 10 seconds |
| 4 | Ge growth at 475 °C with 100 sccm GeH$_4$ flow | Flow 50 sccm TMGa for 15 seconds | Ge growth at 350 °C with 100 sccm GeH$_4$ flow | Flow 50 sccm TMGa for 15 seconds | Flow 50 sccm TMGa for 15 seconds |
| 5 | | Shut off TMGa, pause for 10 seconds | | Shut off TMGa, pause for 10 seconds | Cooling to 350 °C under N$_2$ ambient |
| 6 | | Ge growth at 475 °C with 100 sccm GeH$_4$ flow | | Ge growth at 350 °C with 100 sccm GeH$_4$ flow | Ge growth at 350 °C with 100 sccm GeH$_4$ flow |

FIG. 6

TENSILE STRAINED GE FOR ELECTRONIC AND OPTOELECTRONIC APPLICATIONS

PRIORITY INFORMATION

This application claims priority from provisional application Ser. No. 60/985,728 filed Nov. 6, 2007, which is incorporated herein by reference in its entirety.

BACKGROUND OF THE INVENTION

The invention is related to the field of semiconductor fabrication, and in particular to fabricating highly tensile-strained Ge through lattice-mismatched heteroepitaxy on III-V templates.

In the last decade, strained-Si technology has been utilized to enhance the performance of metal-oxide-semiconductor field effect transistors (MOSFETs). To further improve the MOSFET performance, researchers have moved on to new materials with higher intrinsic carrier mobilities. Among these materials, Ge has been actively studied due to its intrinsically high hole mobility. To date, most of the MOSFETs utilizing Ge channels have been built on bulk Ge substrates or from compressively strained Ge thin films epitaxially grown on SiGe virtual substrates. Compressive strain enhances Ge hole mobility but degrades electron mobility, making it suitable for p-MOSFETs but disadvantageous for n-MOSFETs. It has been demonstrated that compressively strained Ge channels exhibit 10-12× hole mobility enhancement over Si channels. On the other hand, tensile-strained Ge has not been very well studied due to the difficulty of strain engineering with tensile Ge thin films. In theory, tensile strain enhances both electron and hole mobilities of Ge to levels much greater than those in unstrained or compressively-strained Ge and Si making it a highly promising channel material for future CMOS applications.

SUMMARY OF THE INVENTION

According to one aspect of the invention, there is provided a semiconductor structure. The semiconductor structure includes one or more III-IV material-based semiconductor layers. A tensile-strained Ge layer is formed on the one or more a III-IV material-based semiconductor layers. The tensile-strained Ge layer is produced through lattice-mismatched heteroepitaxy on the one or more a III-IV material-based semiconductor layers.

According to another aspect of the invention, there is provided a method of forming a semiconductor structure. The method includes forming one or more III-IV material-based semiconductor layers. Also, the method includes forming a tensile-strained Ge layer on the one or more a III-IV material-based semiconductor layers. The tensile-strained Ge layer is produced through lattice-mismatched heteroepitaxy on the one or more a III-IV material-based semiconductor layers.

According to another aspect of the invention, there is provided an optoelectronic structure. The optoelectronic structure includes one or more III-IV material-based semiconductor layers. A tensile-strained Ge layer is formed on the one or more a III-IV material-based semiconductor layers. The tensile-strained Ge layer is produced through lattice-mismatched heteroepitaxy on the one or more a III-IV material-based semiconductor layers.

BRIEF DESCRIPTION OF THE DRAWINGS

FIG. 3 is a table illustrating a comparison of carrier mobilities in tensile-strained Ge with other semiconductors under consideration for high speed CMOS channels;

FIG. 6 is a table illustrating process variants of different surface preparation techniques to initiate Ge on a GaAs (100) surface;

DETAILED DESCRIPTION OF THE INVENTION

The invention presents a novel technique of fabricating highly tensile-strained Ge through lattice-mismatched heteroepitaxy on III-V templates. Experimental results addressing the challenges of this technique and the results that prove this technique to be effective in incorporating high tensile strain levels in (100) Ge are presented.

Figure 1A:
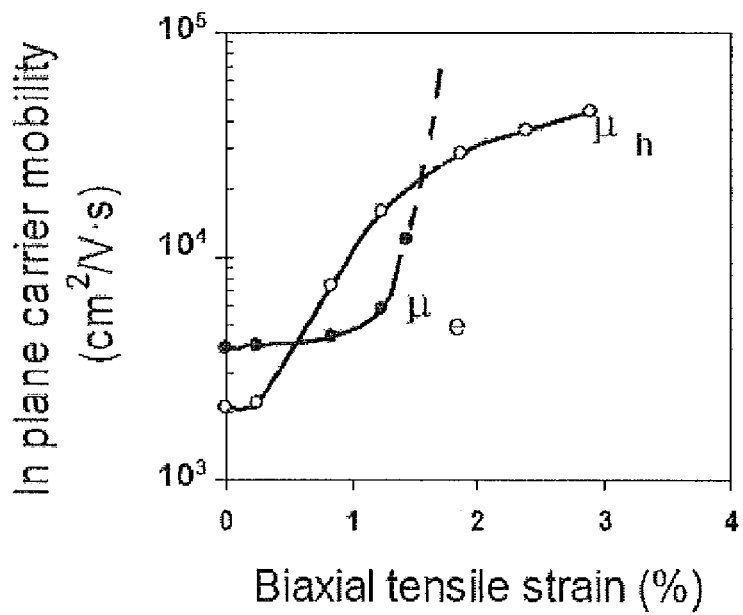
FIGS. 1A-1B are graphs illustrating calculated carrier mobilities and bandgap energy of (100) Ge as function of biaxial tensile strain.
Figure 1B:
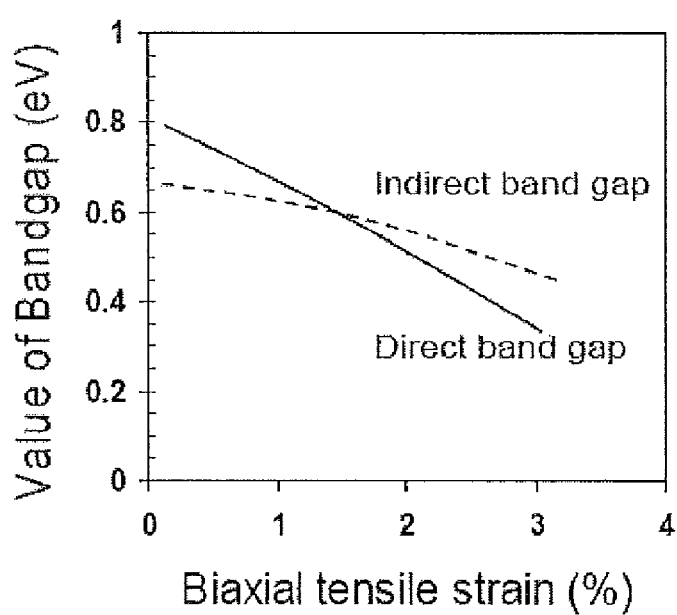

Computational results have predicted that in-plane mobility for both electrons and holes in (100) Ge thin films increase as biaxial tensile strain is applied to the film, illustrated in FIG. 1A. In addition, high levels of biaxial tensile strain can convert Ge into a direct band gap semiconductor, as shown in FIG. 1B. These effects originate from the changes in Ge band structure under biaxial tensile strain, illustrated in FIGS. 2A-2B.

Figure 2A:
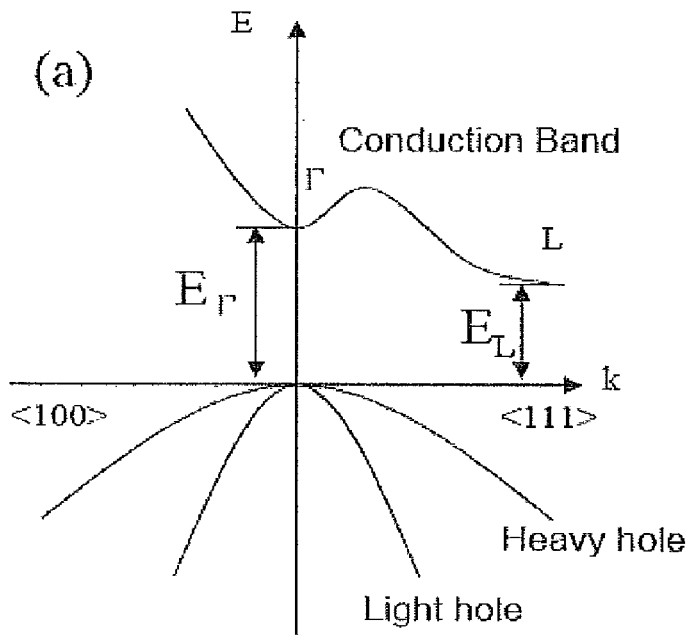
FIG. 2A-2B are graphs illustrating Ge band structure without and with ~1.4% biaxial tensile strain.
Figure 2B:
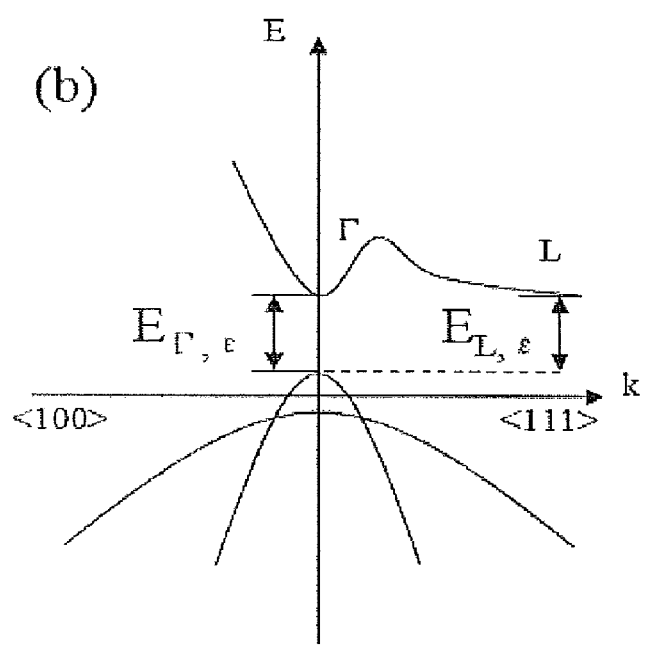

FIG. 2A shows a Ge band structure without biaxial tensile strain and FIG. 2B shows ~1.4% biaxial tensile strain. Biaxial tensile strain, denoted by ε in FIG. 2B, splits the energy levels of the light hole and heavy hole bands at the valence band maxima, shifting holes to the light hole band, resulting in enhanced hole mobility. On the conduction band side, as the direct band gap $E_\Gamma$ shrinks faster than the indirect band gap $E_L$ with biaxial tensile strain, the probability of electrons populating the Γ valley increases.

Because the Γ valley has a lower in-plane effective mass than the L valley, the collective electron mobility increases slowly as more electrons populate the Γ valley. When the biaxial tensile strain is increased above about 1.4% strain, the Γ valley is lower than the L valley, $E_{\Gamma,\epsilon} < E_{L,\epsilon}$, as shown in FIG. 1B, making Ge a direct band gap material. In addition, most electrons in the conduction band will now reside in the Γ valley. This explains the abrupt increase in electron mobility at about 1.4% tensile strain in FIG. 1A. Furthermore, as the direct band gap shrinks, the curvatures of the light hole band and the conduction band Γ valley increase, resulting in further enhancement of hole and electron mobilities.

In fact, tensile-strained Ge potentially possesses some of the highest electron and hole mobilities among group-IV and III-V materials, illustrated in FIG. 3. Furthermore, unlike Si or GaAs, the electron and hole mobilities can be comparable in tensile-strained Ge at a certain amount of strain, making it an excellent material for both p-MOS and n-MOS. When the Ge direct band gap and indirect band gap crossover at about 1.4% of tensile strain, the direct band gap is predicted to have a value about 0.6 eV, corresponding to about 2 μm in band-to-band emission wavelength.

Under even higher tensile strain, the band-to-band emission wavelength can be as long as 10 μm. On the other hand, considering quantum confinement in device design, it is also feasible to tune the emission wavelength down to about 1.5 μm for tensile-strained Ge quantum wells. The potential of covering a wide range of emission wavelength makes tensile-strained Ge an excellent candidate for optoelectronic devices emitting in the near-IR range. Additionally, the direct band gap also greatly increases the absorption coefficient and would enable tensile-strained Ge to be used in high performance IR detectors.

Two techniques have been investigated by different research groups to produce tensile-strained Ge. The first technique utilizes the thermal mismatch between Ge and Si to induce tensile strain in Ge thin films grown on Si substrates by cooling it from high annealing temperatures. Through this technique, enhanced near-IR absorption was demonstrated for Ge detector applications. However, the amount of tensile strain applied by the thermal stress was limited to 0.2%, far below the strain level needed for the direct/indirect band gap crossover.

The second technique proposed to induce tensile strain in Ge was by depositing Ge on relaxed $Ge_xSn_{1-x}$. A direct band gap in tensile-strained $Ge/Ge_{0.87}Sn_{0.13}$ heterostructure on Si was formed. Unfortunately, the Ge—Sn alloy system is inherently unstable and it is difficult to achieve high quality GeSn epitaxy. Although over the years some progress has been made in Si—Ge—Sn technology, this technique has not succeeded in achieving direct-band-gap Ge because the strain induced through Ge epitaxy on Ge—Sn alloys has been limited to about 0.5%. The highest achieved tensile strain level of 0.68% in Ge grown on GeSn buffer was reported. However the quality of this tensile-strained Ge film is limited by the quality of GeSn buffer.

To induce tensile strain via epitaxy, Ge has to be grown on a stable epitaxial template that possesses a lattice constant larger than that of Ge (5.658 Å). The $In_xGa_{1-x}As$ alloy system has lattice constants that vary from the GaAs lattice constant (5.653 Å) to the InAs lattice constant (6.058 Å). High quality $In_xGa_{1-x}As$ compositionally graded buffers (GB) have been grown by metal-organic chemical vapor deposition (MOCVD) and molecular beam epitaxy (MBE) for integration of InP-based devices on GaAs.

These graded buffers are thermodynamically stable and the threading dislocation density (TDD) can be on the order of $10^6$ cm$^{-2}$, providing a platform suitable for electronic and optoelectronic device integration. Therefore, a relaxed $In_xGa_{1-x}As$ compositionally graded buffer grown on GaAs substrate can work as a strain-inducing template for tensile-strained Ge thin film growth. The amount of lattice mismatch between $In_xGa_{1-x}As$ and Ge can be controlled by varying the indium composition. Other alloys such as $Al_xIn_{1-x}As$ can be grown lattice-matched to the graded buffer for device fabrication purposes.

The goal is to produce Ge thin films at high tensile strain levels (0.5% to 1.5%) on high-quality $In_xGa_{1-x}As$ graded buffers (GBs). Unlike epitaxy in Ge/SiGe/Si or Ge/GeSn/Si systems, where all the layers consist of only non-polar group IV elemental semiconductors, Ge epitaxy on III-V compound semiconductors involves an interface of heterovalency between polar and non-polar semiconductors.

A few groups have investigated Ge growth on GaAs substrates using MBE systems but reported different results. A few of them showed non-planar growth even though the lattice mismatch between Ge and GaAs is negligibly small. This was attributed to the difference in valence structure between Ge and GaAs. The even fewer reports on Ge growth on GaAs via CVD did not provide details of the growth process and its influence on film morphology. The first challenge was to understand the impact of heterovalency at the Ge/III-V interface on Ge epitaxy and to identify a growth technique for high quality Ge epitaxy on III-V substrate with low-pressure MOCVD.

A first set of experiments are carried out to investigate the impact of heterovalency during Ge epitaxy on GaAs surfaces independent of strain. The second set of experiments examined the impact of tensile strain on Ge epi-layer growth on $In_xGa_{1-x}As$ graded buffers. The detailed growth experiments are in the results.

All the heterostructures presented in this study were grown on AXT manufactured, epi-ready (100) GaAs substrates or (100) GaAs substrates offcut 6° toward the [011] direction. All films were grown using a custom-built Thomas Swan/AIXTRON low pressure MOCVD system with a close-coupled showerhead configuration. Nitrogen was used as the carrier gas and the chamber pressure was 100 Torr for all growths. The sources used in this study included $GeH_4$, $AsH_3$, Trimethylgallium (TMGa), and Trimethylaluminum (TMAl). The MOCVD system has the unique capability to fabricate Si, Ge, and III-V thin films, thus allowing for the in situ grown Ge/III-V heterostructures demonstrated in this study. The growth temperatures were established by optical pyrometry measurements of the wafer surface.

The system is also equipped with an EpiTT that monitors the reflectivity of the growth surface at wavelength of 635 nm in real time, providing information about growth transitions, initiation times, and layer thicknesses. To illustrate, FIG. 3 shows the wafer surface reflectivity as a function of growth time for a Ge growth on GaAs at 475° C. Before Ge growth started, the GaAs surface reflectivity was constant at 0.35. At 101 sec, $GeH_4$ was introduced to the chamber. Since Ge is more reflective than GaAs at 635 nm wavelength, the surface reflectivity increases upon Ge deposition During the growth, the reflectivity peaks when constructive interference occurs between the reflected beams from the Ge and GaAs surfaces. This condition occurs when $2d = m\lambda/n$ is satisfied, where d is thickness of the Ge film; m is any natural number; $\lambda = 635$ nm is the wavelength of light source used by EpiTT; and n is the Ge refractive index for $\lambda = 635$ nm at 475° C., estimated to be 5.59 from. The valleys of reflectivity intensity occur when $2d = (m+\frac{1}{2})\lambda/n$ is satisfied. The film thickness can be estimated by counting the peaks. For example, at 290 sec, m equals 1 and the Ge film thickness $d_1$ is estimated to be 57 nm.

At 414 seconds, the Ge thickness is about 114 nm, $d_2=2d_1$. It can be observed that the time needed to grow the first $d_1$ (~190 seconds) is longer than that needed for the second $d_1$ (~120 seconds). This suggests that there is an incubation period at the beginning of the Ge growth on GaAs.

The composition and strain of $In_xGa_{1-x}As$ graded buffers were characterized by x-ray diffraction (XRD). Strain levels of Ge thin films were measured by Raman spectroscopy using a Kaiser Hololab system with a 514 nm Ar-ion laser in a backscattering configuration. The surface morphology of the Ge thin films was characterized by atomic force microscopy (AFM). Cross-sectional transmission electron microscopy (XTEM) was used to accurately determine the film thickness and examine the film quality. XTEM specimens were prepared with traditional mechanical grinding techniques, following by an argon ion milling step to establish regions that were electron transparent. The XTEM imaging was conducted on a JEOL 201 OFX system.

As discussed, the different valence characteristics at the GaAs (100) surface pose a challenge to Ge epitaxy. Substrate surfaces greatly affect the initiation of epitaxial growth and thus determine the morphology and the quality of the films. The GaAs surface is known to have different surface reconstructions at different temperatures or under different ambient conditions. These surface reconstructions have different stoichiometry and thus different valence structures, which can potentially affect Ge growth initiation. In order to study this effect, the stoichiometry (Ga-to-As ratio) of the GaAs surfaces is altered by employing different surface preparation techniques and compared the quality of Ge epi-layers initiated on these different surfaces.

Figure 4A:
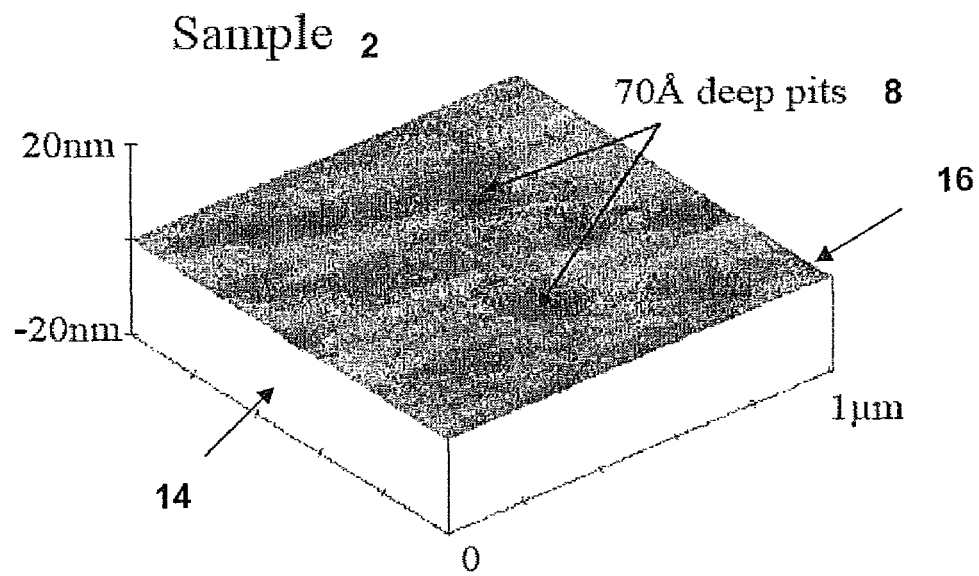
FIGS. 4A-4C are AFM images of Ge initiation layers grown on a (100) GaAs surface with low Ga-to-As ratio and high Ga-to-As ratio.
Figure 4B:
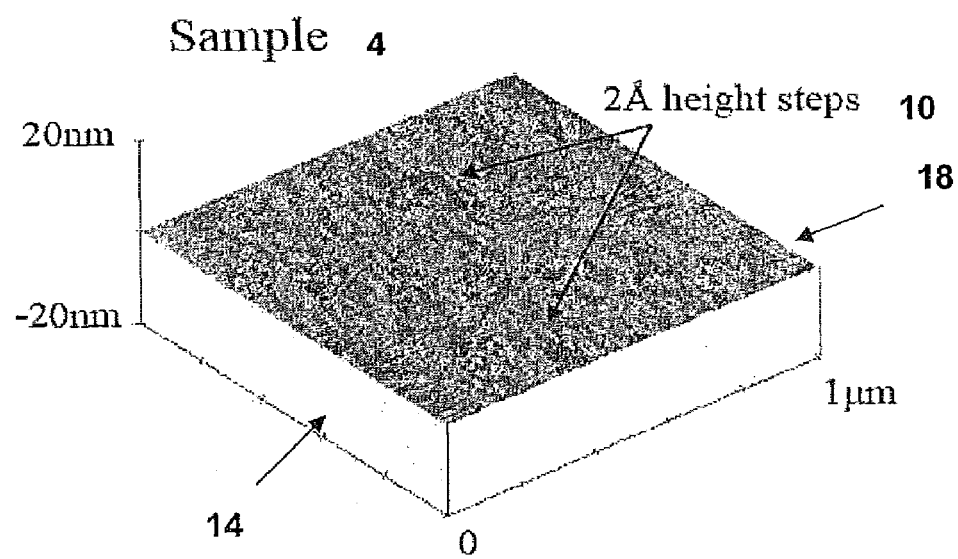
Figure 4C:
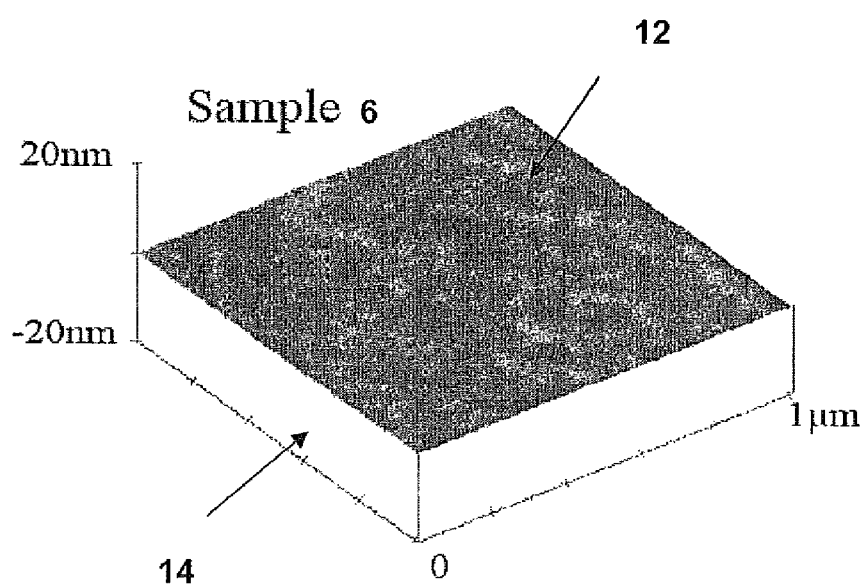

FIGS. 4A-4B shows the morphology of Ge thin films grown on GaAs substrates 14 with three different surface preparation techniques. For all samples, (100) GaAs substrates 14 are used and a GaAs homoepitaxial layer was grown at 650° C. to ensure a high quality epi-ready surface. For sample 2 of FIG. 4A, an $AsH_3$ overpressure was kept until 10 seconds before Ge growth. This procedure preserves the typical GaAs surface obtained during GaAs MOCVD, which is known to be a c(4×4) or d(4×4) surface reconstruction with multiple layers of As on the surface. For sample 4 of FIG. 4B, a 15 second pulse of TMGa flow was inserted between shutting off the $AsH_3$ flow and turning on the $GeH_4$ to consume the excess As and increase the Ga-to-As ratio at the surface. For sample 6 of FIG. 4C, instead of flowing TMGa to consume the excess As on the surface, the substrate was annealed in $N_2$ ambient for 10 minutes at 650° C. before cooling down to Ge growth temperature.

Given that As has a high vapor pressure at this temperature, the anneal should drive some of the As off the surface and form surface reconstructions with higher Ga-to-As ratio (e.g., (2×4) or (4×2) reconstruction). The substrate was then cooled down under an $N_2$-only ambient to the Ge growth temperature and Ge was directly initiated on this surface. Due to different surface conditions and different Ge growth temperatures, it was difficult to keep the Ge thickness identical for all three samples. However, the Ge layer thickness was kept low enough (on the order of 10 nm) to study the film morphology at the initial stage.

Figure 5A:
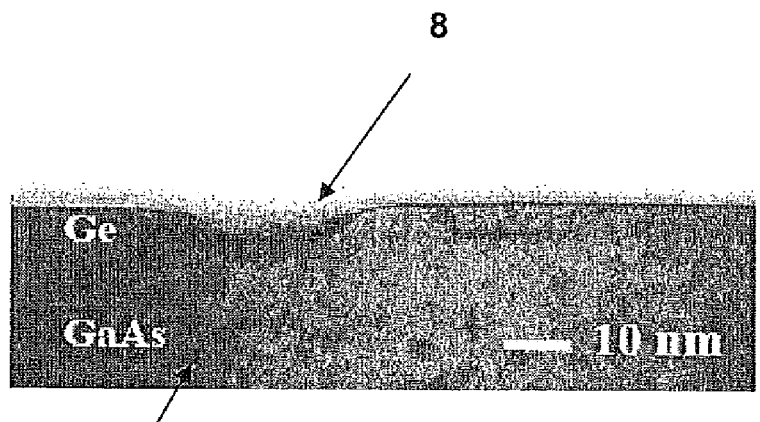
FIGS. 5A-5B are XTEM images of Ge initiation layers grown on a (100) GaAs surface with low Ga-to-As ratio and high Ga-to-As ratio.
Figure 5B:
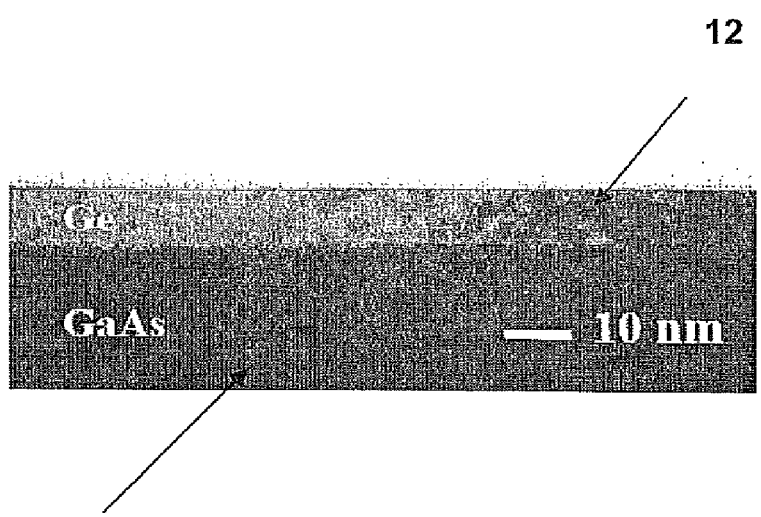

As shown in FIG. 4A, AFM image reveals pits 8 in the Ge layer 16 in sample 2. In the XTEM image shown in FIG. 5A, the pits 8 appeared to penetrate the entire film thickness. The formation of the pits 8 destroys the integrity of the film and prevents the possibility of FET device fabrication with this Ge layer 16. For sample 4, the surface is flat. The features on the surface have average step height 10 of 2 Å, corresponding to the atomic steps on the Ge surface 18. The RMS roughness of this sample is only 0.14 nm, about the lowest that can be achieved during epitaxy. For sample 6, the surface 12 was as flat as that observed with sample 4, again with no pit formation, but the atomic steps were not as distinct as in sample 4. A cross-sectional TEM picture of sample 6 is shown in FIG. 5B.

The results indicate that a surface with higher Ga-to-As ratio facilitates high quality Ge epitaxy. The results are consistent for a wide range of Ge growth temperatures, between 350° C. and 500° C. A possible explanation of this phenomenon relates to the formation energy of Ge—Ga bonds and Ge—As bonds. It is observed that during Ge epitaxy on GaAs by MBE, the Ge film initiated by forming a Ge—Ga dimerized (1×2) surface, which suggests that the Ge—Ga dimer has a lower energy state than the Ge—As dimer.

Observations are consistent with this theory. For the case of sample 2, where the GaAs surface 14 was covered by multiple layers of As, Ge atoms needed to diffuse through the As layers to bond with Ga atoms. It is speculated that the excess As atoms formed clusters that locally impeded Ge atom attachment, facilitating the pit formation 8. For the GaAs surfaces with a high Ga-to-As ratio (samples 4 and 6), there were more available surface sites for Ge atoms to bond, resulting in a uniform epi-layer. When thicker films were grown using the procedures for samples 4 and 6, the films were found to keep the perfect flatness regardless of the thickness.

Figure 7:
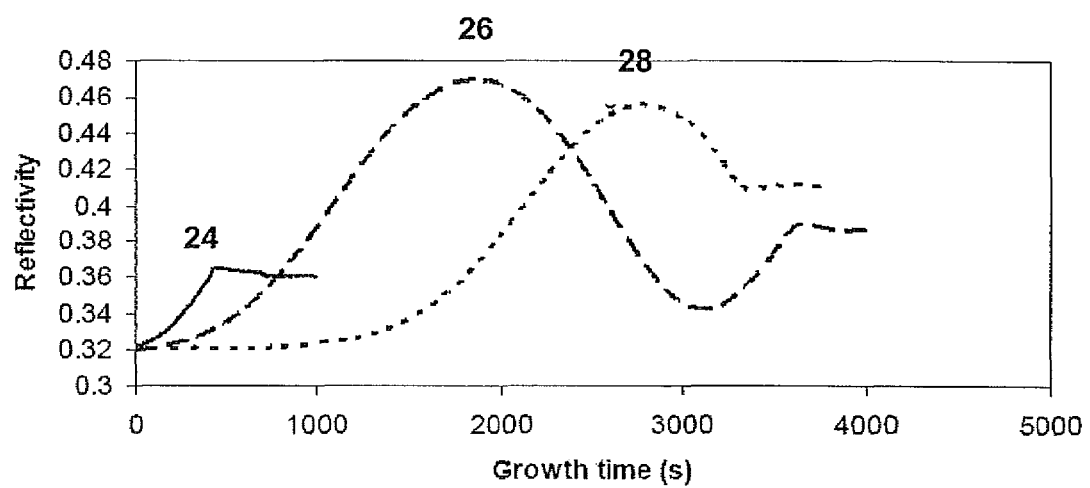
FIG. 7 is a graph illustrating wafer surface reflectivity as a function of growth time for three different samples: surface annealed at 650° C., Ge growth at 350° C.; TMGa flowed at 475° C., Ge growth at 350° C.; TMGa flowed at 350° C., and Ge growth at 350° C.

The invention demonstrates two different techniques to achieve GaAs surfaces with high Ga-to-As ratio. The technique of pulsing TMGa to consume excess surface As works best at higher Ge growth temperature (450° C.-500° C.). For example, for sample 4 described above, the TMGa pulse was introduced to the chamber at 475° C., followed by $GeH_4$ flow at the same temperature and the film was high quality. However, for another sample not shown in FIGS. 4A-4B or 5A-5B, but shown as sample d in FIG. 6, when TMGa was flowed at 350° C., the subsequent Ge growth at 350° C. had a very long incubation time, as shown by EpiTT data in FIG. 7 line 28, and yielded a film with much higher surface roughness.

This is attributed to the likely incomplete pyrolysis of TMGa at 350° C. In another sample, when TMGa was flowed at 475° C. followed by cooling the substrate to 350° C. under an $N_2$-only ambient to initiate Ge growth as shown in sample e of FIG. 6, the initiation time was reduced, shown in FIG. 7 line 26, but was still longer than the case for sample c described in FIG. 6, shown in FIG. 7 line 24, which was grown at the same temperature with the $N_2$ anneal at 650° C. surface preparation technique. In addition, sample e had surface roughness of 0.27 nm, while sample c has lower roughness of 0.18 nm. Furthermore, SIMS analysis revealed a carbon concentration peak of $3\times10^{19}$ cm$^{-3}$ at the Ge/GaAs interface in sample e.

To explain the phenomena described above, one needs to discuss the details of TMGa pyrolysis and its reaction with the surface. Larsen et al. have shown that TMGa pyrolysis is completely inhibited at temperatures below 400° C. in a nitrogen ambient. Thus only a very small fraction of the TMGa introduced at 350° C. reacts with the surface, and the surface Ga-to-As ratio does not change significantly. Most of the TMGa was simply pumped away. When $GeH_4$ was introduced in the next step, the surface it faced was still covered by excess As, leading to the long incubation time and defective Ge layer.

At temperatures above the minimum pyrolysis temperature, it was suggested that TMGa pyrolysis produces gallium complexes in the form of Ga(CH$_n$)$_x$. Predominantly, n equals to 3 and the process can be summarized by the following reaction scheme.

$$TMGa(gas) \rightarrow Ga(CH_3)_x(ad)+(3-x)CH_3 \ (1 \leq x \leq 3)$$
$$T<500°\ C. \quad (1)$$

$$TMGa(gas) \rightarrow Ga(ad)+3CH_3 \ T>500°\ C. \quad (2)$$

For GaAs growth under 500° C., GaAs is formed though the following reaction:

$$AsH_3(gas) \rightarrow AsHy(ad)+(3-y)H \ (0 \leq y \leq 3) \quad (3)$$

$$Ga(CH_3)_x(ad)+AsHy(ad) \rightarrow GaAs+hydrocarbons(gas)$$
$$T<500°\ C. \quad (4)$$

The temperature 500° C. here is the threshold temperature of complete pyrolysis, but it can be as low as 465° C. for H$_2$ ambient and as high as around 530° C. for N$_2$ and He ambient. When TMGa was introduced to the chamber of a N$_2$-only ambient at 475° C., partial pyrolysis occurred as described by reaction (1). Absence of AsH$_3$ prevented reactions reaction (3) and (4). The gallium complexes, mainly monomethylgallium(MMGa) and dimethylgallium(DMGa), migrate on the surface until trapped by surface As atoms, forming a self-limiting monolayer. This monolayer absorption of gallium complex is utilized as the self-limiting mechanism for atomic layer epitaxy (ALE) of GaAs. Without AsH$_3$ in the ambient, the Ga—C bonds in MMGa and DMGa disassociate only when GeH$_4$ was introduced, through the following reaction:

$$GeH_4(gas) \rightarrow GeHy(ad)+(4-y)H \ (0 \leq y \leq 3) \quad (5)$$

$$Ga(CH_3)_x(ad)+GeHy(ad)+As(surface) \rightarrow GaAs+Ge+$$
$$hydrocarbons \ (gas) \ T<500°\ C. \quad (6)$$

Therefore the temperature at which GeH4 is first introduced determines the temperature where reaction (6) can proceed and affects the decomposition of the gallium complexes. It has been found that during low temperature GaAs growth with TMGa as the Ga source, a small portion of the third Ga—C bond would not disassociate, resulting in C incorporation in the GaAs as a p-type dopant. The carbon doping level was found to increase monotonically with decreasing growth temperature and levels on the order of $10^{20}$ cm$^{-3}$ were obtained through this mechanism at temperatures around 400° C. This explains the carbon concentration of $3 \times 10^{19}$ cm$^{-3}$ found at the Ge/GaAs interface for the sample where GeH$_4$ was introduced at 350° C. after the TMGa pulse at 475° C. The long incubation time and high roughness of this sample could be induced by high C concentration or incomplete As consumption on the surface. In contrast, for sample 4 where the TMGa pulse was introduced to chamber at 475° C. and GeH$_4$ growth was started at the same temperature, the carbon concentration was found to be $2 \times 10^{17}$ cm$^{-3}$, and the film was much smoother.

These results show that the method of flowing TMGa is difficult to implement at low growth temperature, around 350° C. In contrast, the second method to obtain high Ga-to-As ratio, which is simply to anneal the surface at higher temperature (500° C. to 650° C.) in a N$_2$-only ambient before cooling down to the Ge growth temperature, was found to be more robust and reliable and yielded smoother Ge films. Annealing at 500° C. to 650° C. for 5 to 15 min was effective at yielding high quality Ge growth on GaAs at any temperature between 350° C. and 500° C. The annealing preparation technique for the rest of the experiments is applied, with slight modifications when applicable.

Offcut substrates are commonly used for growth of GaAs on Ge, in order to avoid anti-phase boundary (APB) formation in the GaAs layer. APB formation is not a concern for Ge growth on GaAs, and as shown above, high quality Ge thin films are grown on exact-(100) GaAs substrates. Nevertheless, fabrication of Ge optoelectronic devices may require Ge layers to be sandwiched between two III-V semiconductor layers to obtain desired quantum confinement characteristics. Offcut substrates would be preferable for these structures to suppress APB formation in the III-V capping layer. It has been shown that a 6° offcut is sufficient to eliminate APBs in GaAs grown on Ge. Hence, Ge on a (100) GaAs substrate is grown with 6° offcut towards the [011] direction to investigate the influence of substrate offcut on Ge growth.

Figure 8:
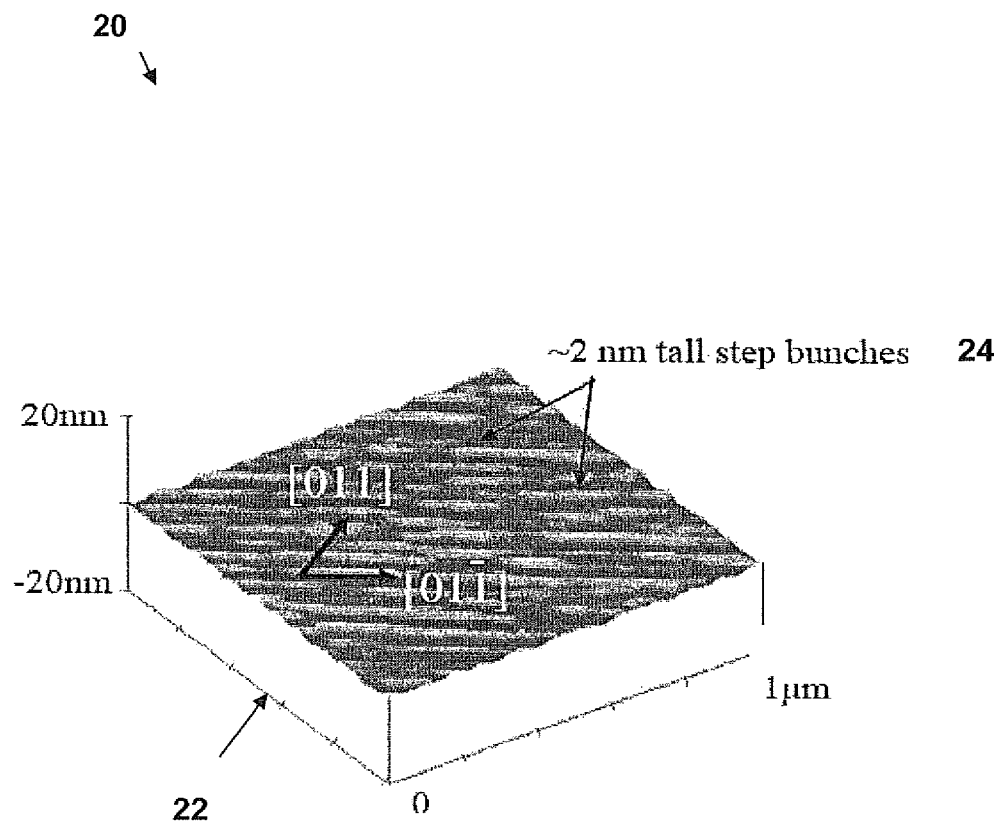
FIG. 8 is an AFM image of Ge grown at 475° C. on a (100) GaAs substrate with 6° offcut towards [011]

FIG. 8 shows the surface morphology of a Ge thin film grown 20 on an offcut substrate 22. Using the same surface preparation and growth condition for sample b as described in FIG. 6, the Ge film20 grown on this 6° offcut substrate 22 was found to form step bunches 24 along the [01$\bar{1}$] direction, equally spaced in the [011] direction. The height of these step bunches 24 are about 2 nm and the spacing between them is about 50 nm, resulting in a surface RMS roughness of 0.64 nm, about four times higher than the Ge film grown on substrate without offcut under the same condition. The step bunches 24 and extra roughness caused by using offcut substrates might pose a challenge to future device fabrication.

Figures 9A, 9B, 9C:
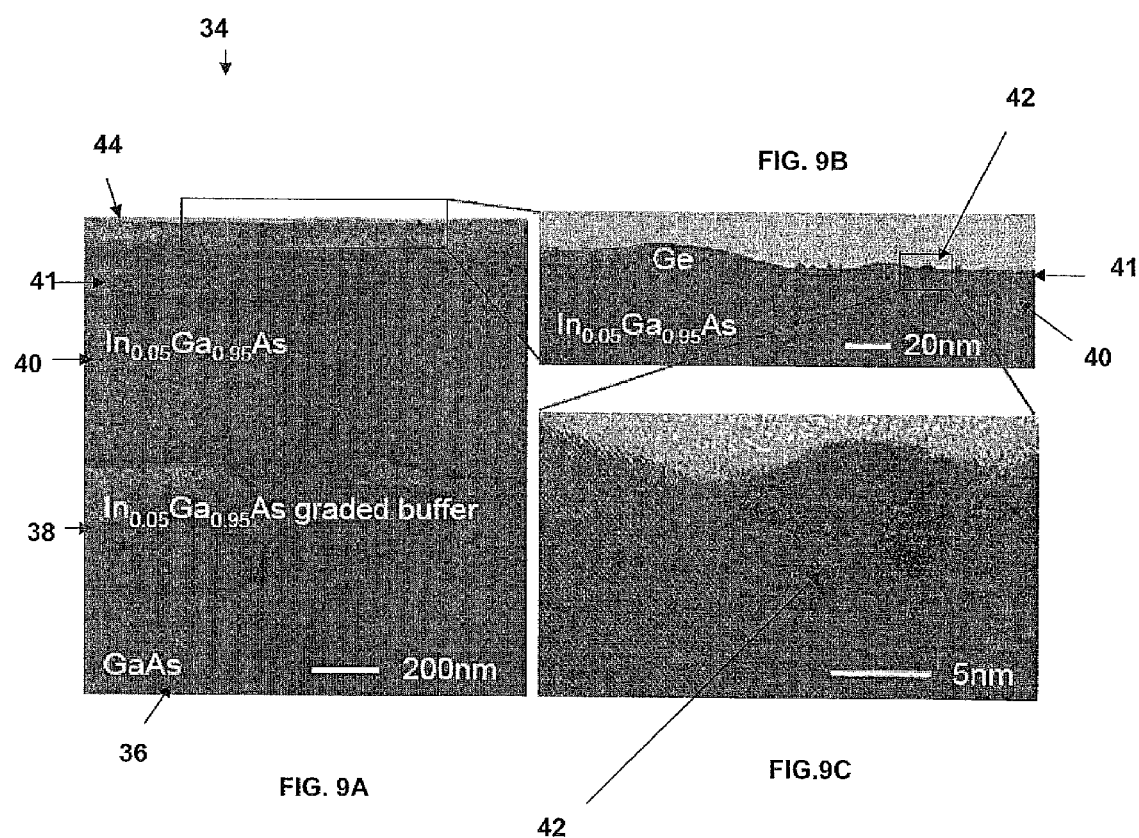
FIGS. 9A-9C are XTEM images showing Ge growth blocked by defects on $In_{0.05}Ga_{0.95}As$ surface generated from annealing at 650° C.

Extending the results of Ge growth on GaAs, the growth of tensile-strained Ge on In$_x$Ga$_{1-x}$As are studied. To grow Ge/In$_x$Ga$_{1-x}$As heterostructures 34, one can start with a (100) GaAs substrates 36 and grow a GaAs homoepitaxial layer followed by the In$_x$Ga$_{1-x}$As compositionally graded buffer 38 at 700° C., as shown in FIG. 9A. The compositionally graded buffers 38 are capped with relaxed uniform composition In$_x$Ga$_{1-x}$As layers 40 with TDD<$5 \times 10^6$ cm$^{-2}$, which serve as the strain-inducing templates for the tensile-strained Ge growth. The final In composition in these uniform composition layers ranged from 5% to 25%. The graded buffers 40 were then capped with a 20 Å, strained GaAs layer 41. This strained GaAs layer 41 reduces the critical thickness of the subsequent tensile-strained Ge layer 44. Nevertheless, it retains the studied Ge/GaAs interface for Ge initiation, although strain has been incorporated.

The annealing technique described earlier is adopted to prepare this surface for Ge layer initiation. However, after the uniform-composition-In$_x$Ga$_{1-x}$As/strained-GaAs surface was annealed at 650° C. without AsH$_3$ overpressure, one can observe defects 42 on the surface as shown in FIG. 9B-9C. These defects 42 destroyed the integrity of the surface and blocked the growth of the subsequent Ge films. It is suspected that evaporation enhances InGaAs/GaAs interdiffusion, and In-rich areas form and locally melt. Even the 20 Å strained GaAs layer 41 does not offer enough protection. The defects 42 form during the melting and re-solidifying of part of the surface. After the annealing temperature is reduced to 550° C. to prepare the surface, the formation of the melting defects are eliminated.

Figure 10A:
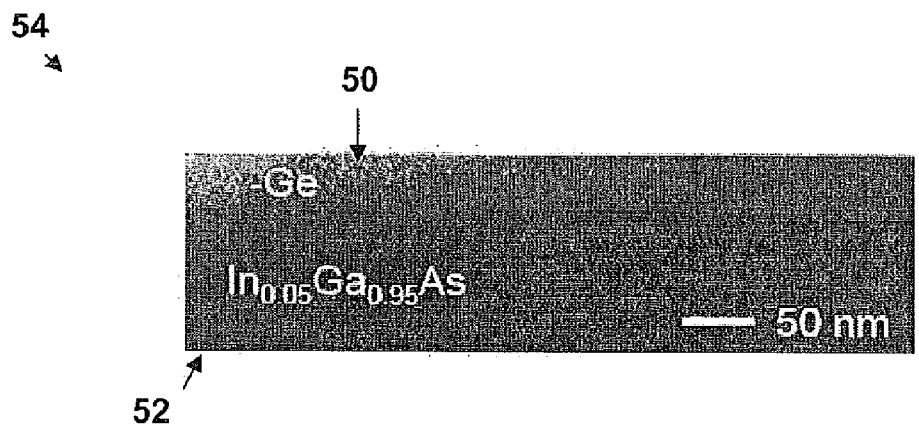
FIGS. 10A-10C are XTEM images of tensile strained Ge layers grown on $In_xGa_{1-x}As$ with different In content: 5%, 11%, and 21%, respectively.
Figure 10B:
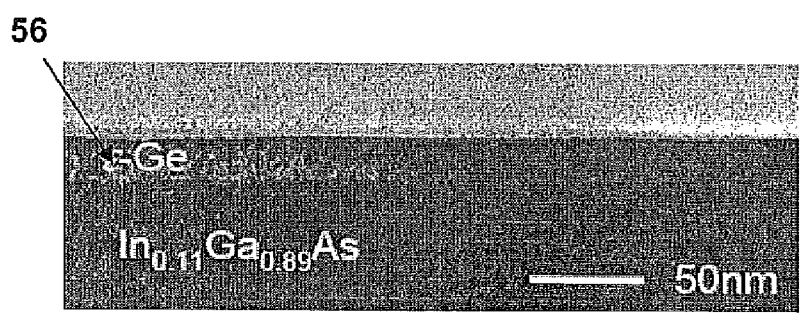
Figure 10C:
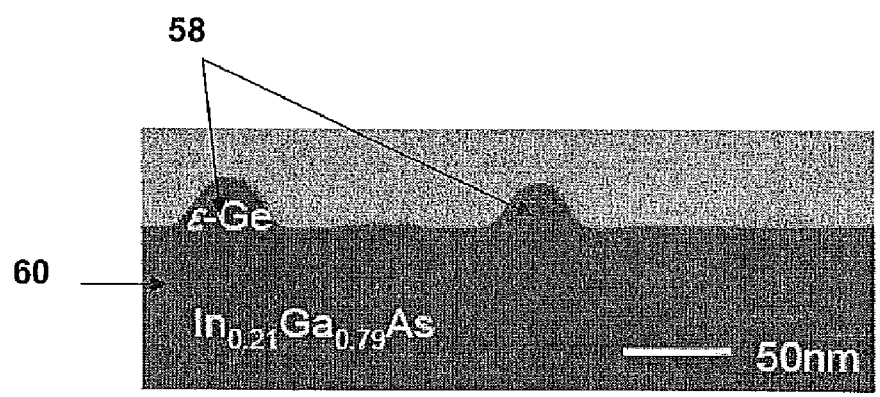

With the surface preparation step modified to annealing at 550° C., one is able to grow defect-free tensile-strained Ge thin films on In$_x$Ga$_{1-x}$As graded buffers with varying In content, as shown in FIGS. 10A-10C. For Ge 50 grown on graded buffers 52 with low In content (x$_{In}$~5%) as shown in FIG. 10A, the film 54 was perfectly flat and free of extended defects. At intermediate In content (x$_{In}$~10%) as shown in FIG. 10B, the film 56 was free of defects but was slightly undulated due to strain-driven surface diffusion. At high In content (~20%), the mismatch was so high that the Ge epilayer grown on In$_{0.21}$Ga$_{0.79}$As 60 formed quantum dots 58 to accommodate the large amount of strain, as shown in FIG. 10C.

Figure 11A:
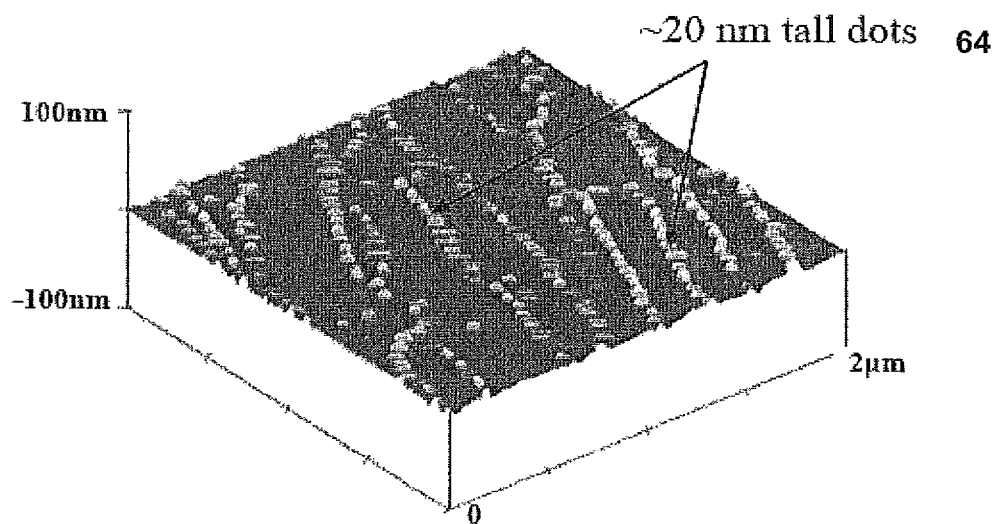
FIGS. 11A-11B are AFM images of Ge grown on $In_{0.21}Ga_{0.79}As$ and $In_{0.21}Ga_{0.79}As$ graded buffer surface revealing the step bunches.
Figure 11B:
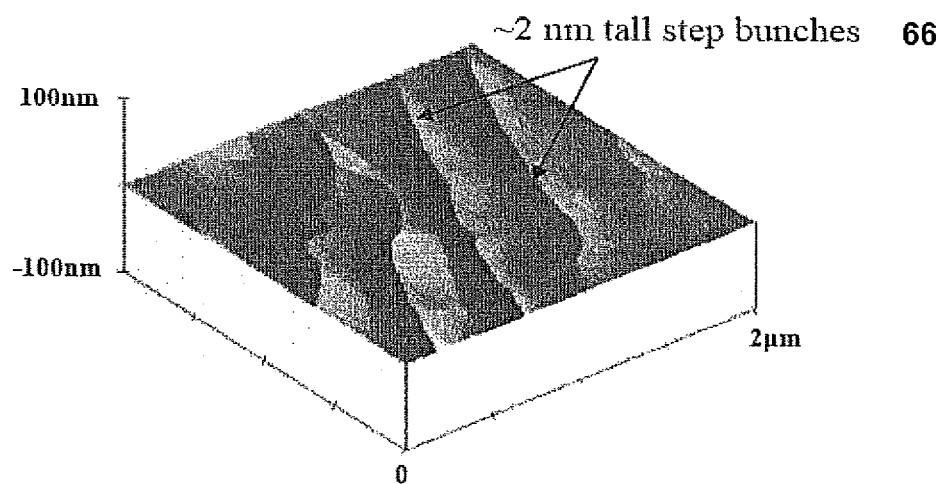

Interestingly, AFM images, as shown in FIG. 11A, show that all the nucleation of Ge quantum dots 64 occurred at the step bunches 66 on the In$_x$Ga$_{1-x}$As surface, as shown in FIG. 11B. In general, no misfit dislocations are found at the Ge/InGaAs interface, suggesting that there is no strain relaxation and the Ge structures were fully elastically strained to match the lattice constant of the virtual substrate. This was later confirmed by the measured values of tensile strain in these samples.

A thin tensile-strained Ge layers are grown to stay well below the thermodynamic critical thickness, which made it difficult to measure the strain in these Ge layers via XRD. Instead, one can use Raman spectroscopy to measure the strain levels in these Ge layers. Raman spectroscopy is widely used for stress measurement in silicon integrated circuits, and the (100) back scattering configuration used here is very convenient for measuring strain in very thin films. For this configuration, only longitudinal optical (LO) phonons provide an active Raman mode. The relation between the shift in this Raman mode, $\Delta\omega$, and the biaxial stresses, $\sigma_{xx}$ and $\sigma_{yy}$, is given by Eq.7:

$$\Delta\omega = \frac{1}{2\omega_0}[(pS_{12} + q(S_{11} + S_{12})](\sigma_{xx} + \sigma_{yy}) \quad \text{Eq. (7)}$$

Here $\omega_0$ is the frequency of this Raman mode without biaxial stress. $S_{ij}$ are the elastic compliance tensor elements of Ge. p and q are phonon deformation potentials for Ge. If $\sigma_{xx}=\sigma_{yy}$, this equation can be simplified as $\Delta\omega=b\epsilon_v$, with $\epsilon_v$ as biaxial tensile strain and $b=[m-n(C_{12}/C_{11})]/\omega_0$. The variable b is calculated to be $-415\pm40$ cm$^{-1}$ and used this method to measure tensile strain in Ge films grown on $Ge_{0.975}Sn_{0.025}$.

Figure 12:
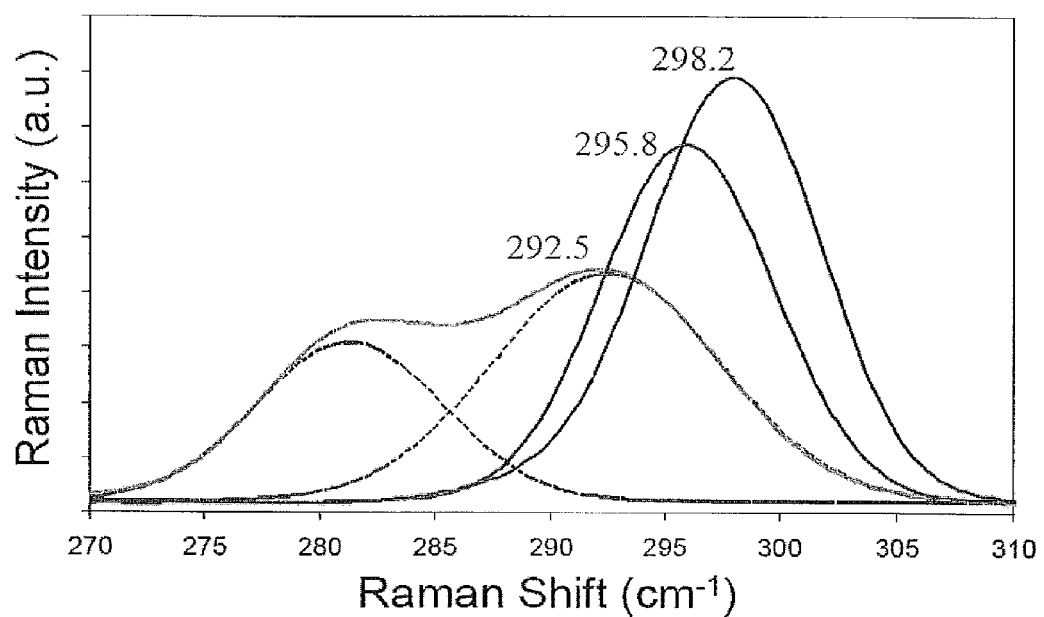
FIG. 12 is a graph illustrating the room temperature Raman spectrum of bulk Ge, Ge thin film grown on $In_{0.11}Ga_{0.89}As$, and Ge quantum dots grown on $In_{0.21}Ga_{0.79}As$.

FIG. 12 shows Raman spectrum data obtained from tensile-strained Ge films grown on $In_xGa_{1-x}As$. Given b is a negative number, tensile strain causes a down-shift of the Raman mode. For the continuous tensile-strained Ge thin films grown on $In_{0.11}Ga_{0.89}As$, the measured shift from bulk Ge Raman peak, $\Delta\omega$ is $-2.4\pm0.1$ cm$^{-1}$. The error comes from the resolution limit of the Raman setup. Using this value and $b=-415\pm40$ cm$^{-1}$, one can deduce the level of tensile strain in this Ge film to be $\epsilon_\parallel=0.58\%\pm0.08\%$.

For the tensile-strained Ge QDs grown on $In_{0.21}Ga_{0.79}As$, due to incomplete QD surface coverage, the Raman spectrum is composed of the tensile-strain Ge peak and the $In_{0.21}Ga_{0.79}As$ peak. The LO phonon energy in $In_{0.21}Ga_{0.79}As$ is about 34.5 meV (linearly interpolated from GaAs and InAs), very close to the LO phonon energy of Ge, 37 meV. Therefore the two peaks are very close together and overlap with one another. After deconvolution, the $\Delta\omega$ for tensile-strained Ge QDs was found to be $-5.7\pm0.1$ cm$^{-1}$ and the corresponding level of tensile strain is $1.37\%\pm0.15\%$.

Figure 13:
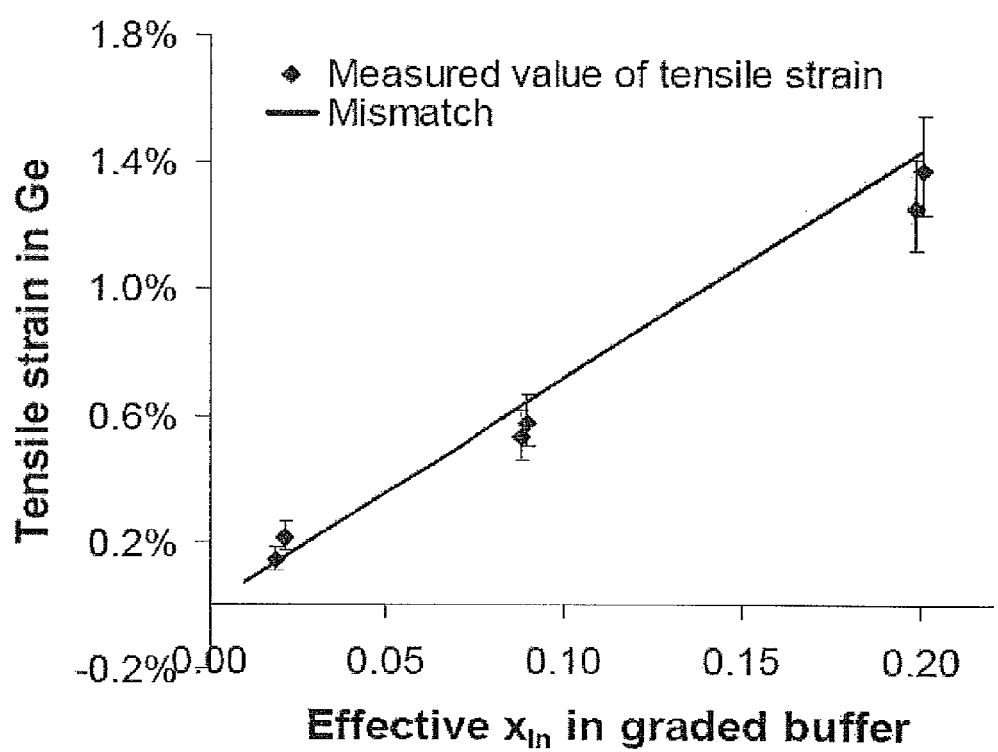
FIG. 13 is a graph illustrating the comparison of strain levels measured by Raman spectroscopy in tensile-strained Ge layers and the theoretical lattice mismatch between Ge and $In_xGa_{1-x}As$.

The measured strain levels in all samples are plotted in FIG. 13 against the effective In content in the $In_xGa_{1-x}As$ cap layer. An "effective In content" was used to compensate for the fact that the uniform composition $In_xGa_{1-x}As$ layers were not 100% relaxed as measured by XRD reciprocal space maps. The uncertainty in the measured strain comes from the measurement resolution limit and the error in the value of b.

FIG. 13 shows that the actual strain levels in the Ge epilayers are very close to the theoretical value of lattice mismatch. This confirms that essentially no strain relaxation occurred, as suggested by the XTEM results from FIGS. 10A-10C. Note the planar, 0.6% tensile-strained Ge film is already interesting for FET applications. FIG. 1 shows that such a film should support an electron and a hole mobility of 3000 cm$^2$/v·s. Such a symmetric, and high, mobility is not currently available in any other single semiconductor material. Thin film planarization techniques such as chemical mechanical planarization (CMP) can also be used to reduce surface roughness and improve the film quality for device fabrication.

Figure 14:
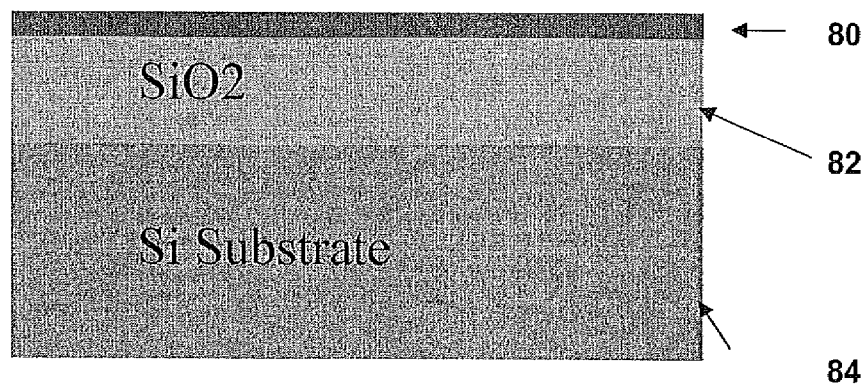
FIG. 14 is a schematic diagram illustrating tensile-strained Ge on insulator (GOI) structure produced by wafer bonding as formed in accordance with the invention.

As an alternative approach for the final layer structure 78, wafer bonding can be used to reduce the thickness of the structure underneath the tensile Ge layer 80 and replace it with other layers such as an insulating oxide 82 on a substrate 84, such as Si or the like, for the appropriate application, as shown in FIG. 14. With proper usage of wafer bonding, tensile-strained Si on insulator, tensile or compressive strained SiGe on insulator, and compressive strained Ge on insulator substrates have been demonstrated as platform for mobility enhanced MOSFETS.

Thermal stability of tensile-strained Ge films can be experimented and include more extensive measurements of strain levels via x-ray diffraction. In addition, one can characterize the electrical and optical properties of tensile-strained Ge thin films.

The invention describes a technique for high quality Ge epitaxial layers being grown by CVD on GaAs and $In_xGa_{1-x}As$. It has been observed that surfaces with high Ga-to-As ratio are essential to initiate smooth, pit-free Ge thin films on these materials. It has been shown by annealing under $N_2$-only ambient between 550° C. and 650° C. (depending on the In content of the underlying relaxed buffer) is a reliable technique to achieve surfaces with high Ga-to-As ratio. Integrating this knowledge with $In_xGa_{1-x}As$ compositionally graded buffer technology, one can successfully grow tensile-strained Ge thin films and quantum dots on $In_xGa_{1-x}As$. Low growth temperatures between 350° C. and 500° C. suppress strain relaxation via formation of misfit dislocations. Tensile strain levels as high as 0.58% in Ge thin films and 1.37% in Ge quantum dots were achieved, far higher than previously achieved values via other methods. These heterostructures provide a platform that will enable us to further study the electrical and optical properties of tensile-strained Ge and to test the predictions of theoretical computations.

Although the present invention has been shown and described with respect to several preferred embodiments thereof, various changes, omissions and additions to the form and detail thereof, may be made therein, without departing from the spirit and scope of the invention.

What is claimed is:

1. A method of forming a semiconductor structure comprising: providing one or more III-V material based semiconductor layers, the one or more III-V material based semiconductor layers comprise a relaxed uniform composition $In_xGa_{1-x}As$ layer formed on a $In_xGa_{1-x}As$ compositionally graded buffer, where x defines an effective In content; and forming a tensile-strained Ge layer on said one or more III-V material based semiconductor layers, said tensile strained Ge layer being produced through lattice-mismatched heteroepitaxy on said one or more III-V material based semiconductor layers, and said tensile-strained Ge layer comprises quantum dots.

2. The method of claim 1, wherein said one or more III-V material-based semiconductor layers comprise GaAs layer.

3. The method of claim 1, wherein one or more III-V material-based semiconductor layers comprise GaAs substrate.

4. The method of claim 1, wherein the effective In content is between 0.05 and 0.2, said tensile-strained Ge layer comprises no defects.

5. The method of claim 1, wherein the effective In content is greater than 0.2.

6. The method of claim 1, wherein said tensile-strained Ge layer comprises a strain greater then 0.5%.

\* \* \* \* \*